(12) United States Patent
Yu

(10) Patent No.: US 11,329,037 B2
(45) Date of Patent: May 10, 2022

(54) DISPLAY MODULE AND ELECTRONIC DEVICE

(71) Applicant: WUHAN CHINA STAR OPTOELECTRONICS TECHNOLOGY CO., LTD., Hubei (CN)

(72) Inventor: Pengfei Yu, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 14 days.

(21) Appl. No.: 17/041,054

(22) PCT Filed: Jun. 30, 2020

(86) PCT No.: PCT/CN2020/099392
§ 371 (c)(1),
(2) Date: Sep. 24, 2020

(65) Prior Publication Data
US 2021/0398965 A1    Dec. 23, 2021

(30) Foreign Application Priority Data
Jun. 17, 2020  (CN) .......................... 202010551783.8

(51) Int. Cl.
*H01L 25/18* (2006.01)
*H01L 23/00* (2006.01)
*G02F 1/1345* (2006.01)
*H01L 23/498* (2006.01)

(52) U.S. Cl.
CPC .......... *H01L 25/18* (2013.01); *G02F 1/13452* (2013.01); *H01L 23/562* (2013.01); *H01L 23/4985* (2013.01)

(58) Field of Classification Search
CPC . H05K 1/00; H05K 1/02; H05K 1/028; H01L 23/562; H01L 23/4985; H01L 25/18; H01L 25/5246; G02F 1/13452; G02F 1/133308
USPC ........ 361/749–750, 760–767, 782–784, 803, 361/814; 174/254–260, 520–525; 349/149–151
See application file for complete search history.

(56) References Cited

U.S. PATENT DOCUMENTS

| | | | |
|---|---|---|---|
| 8,829,790 B2 * | 9/2014 | Yee .......................... | G06F 1/169 313/512 |
| 9,941,335 B2 * | 4/2018 | Park ...................... | H01L 27/323 |
| 2011/0187965 A1 * | 8/2011 | Ooishi .................... | H05K 1/00 349/62 |

(Continued)

FOREIGN PATENT DOCUMENTS

CN         208046996 U      11/2018

*Primary Examiner* — Tuan T Dinh
(74) *Attorney, Agent, or Firm* — Mark M. Friedman

(57) ABSTRACT

A display module and an electronic device are provided. The display module includes a substrate, a display part, a driving chip, a flexible circuit, and a buffer part. The substrate includes a soldering portion. The display part is disposed on a light emitting side of the substrate. The driving chip is disposed on a light emitting side of the soldering portion. The flexible circuit board is bent from a first surface of the soldering portion to a second surface of the soldering portion. The buffer part is disposed between the flexible circuit board and the soldering portion.

16 Claims, 3 Drawing Sheets

(56) References Cited

U.S. PATENT DOCUMENTS

| | | | |
|---|---|---|---|
| 2011/0199741 A1* | 8/2011 | Yokonuma | H05K 1/028 |
| | | | 361/749 |
| 2014/0092338 A1* | 4/2014 | Miyazaki | G02F 1/133308 |
| | | | 349/58 |
| 2014/0217382 A1* | 8/2014 | Kwon | H01L 51/5246 |
| | | | 257/40 |
| 2016/0218153 A1* | 7/2016 | Kim | G09G 3/00 |
| 2018/0059728 A1 | 3/2018 | Kim et al. | |

* cited by examiner

DISPLAY MODULE AND ELECTRONIC DEVICE

FIELD OF INVENTION

The present disclosure relates to the technical field of display, and particularly to a display module and an electronic device.

BACKGROUND

In order to ensure power supply of a liquid crystal display panel, a printed circuit board (PCB) is generally configured to be soldered with important electronic components to process an input signal of the display panel and then input the input signal to a driving chip through a flexible circuit board. Therefore, signal processing and power supply in the display panel are realized.

However, after the flexible circuit board is bent, there is a certain gap between the flexible circuit board and a substrate, which causes constant friction between the flexible circuit board and the substrate. Therefore, the flexible circuit board is easy to wear, which reduces product yield.

SUMMARY OF DISCLOSURE

The present disclosure provides a display module and an electronic device, which can prevent wear of a flexible circuit board and improve product yield.

The present disclosure provides a display module comprising a substrate, a display part, a driving chip, a flexible circuit, a printed circuit board, and a buffer part. The substrate comprises a soldering portion. The display part is disposed on a light emitting side of the substrate. The driving chip is disposed on a light emitting side of the soldering portion. The flexible circuit board is bent from a first surface of the soldering portion to a second surface of the soldering portion. A first end of the flexible circuit board is connected to the driving chip. The printed circuit board is connected to a second end of the flexible circuit board. The buffer part is disposed between the flexible circuit board and the soldering portion.

The present disclosure further provides an electronic device comprising the aforementioned display module The present disclosure provides a display module and an electronic device, comprising a substrate, a display part, a driving chip, a flexible circuit, a printed circuit board, and a buffer part. The substrate comprises a soldering portion. The display part is disposed on a light emitting side of the substrate. The driving chip is disposed on a light emitting side of the soldering portion. The flexible circuit board is bent from a first surface of the soldering portion to a second surface of the soldering portion. A first end of the flexible circuit board is connected to the driving chip. The printed circuit board is connected to a second end of the flexible circuit board. The buffer part is disposed between the flexible circuit board and the soldering portion. Because the buffer part is disposed between the flexible circuit board and the soldering portion, friction between the flexible circuit board and the substrate can be reduced, thereby preventing wear of the flexible circuit board and improving product yield.

BRIEF DESCRIPTION OF DRAWINGS

In order to more clearly illustrate technical solutions in embodiments of the present disclosure, a brief description of accompanying drawings used in a description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
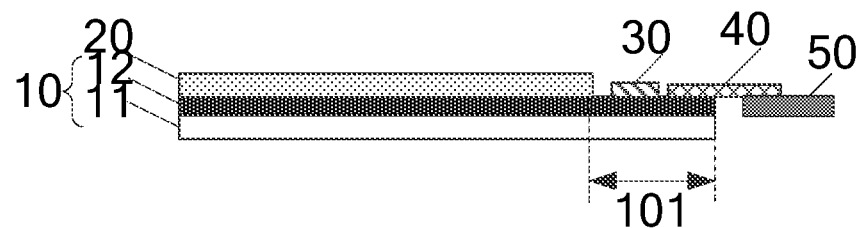
FIG. 1 is a cross-sectional view of a display module when a flexible circuit board is in a flat state in the prior art.

Technical solutions in embodiments of the present disclosure will be clearly and completely described below in conjunction with accompanying drawings in the embodiments of the present disclosure. Apparently, the described embodiments are merely some of the embodiments of the present disclosure and not all embodiments. All other embodiments obtained by those skilled in the art based on the embodiments of the present disclosure without creative labor are within the claimed scope of the present invention.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Figure 2:
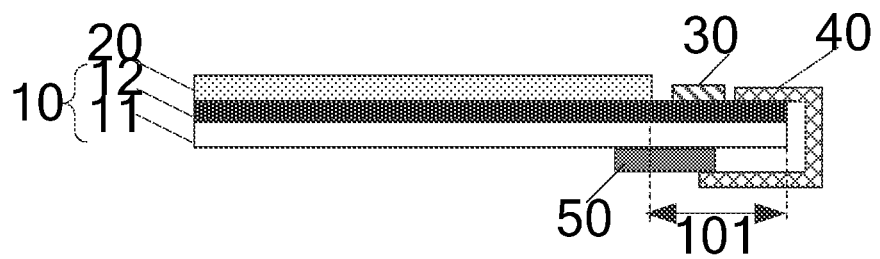
FIG. 2 is a cross-sectional view of the display module when the flexible circuit board is in a bent state in the prior art.

Please refer to FIG. 1 and FIG. 2, a current display module comprises a substrate 10, a display part 20, a driving chip 30, a flexible circuit 40, and a printed circuit board 50.

The substrate 10 comprises a soldering portion 101. In an embodiment, the substrate 10 may comprise a backlight module 11 and a driving layer 12.

The display part 20 is disposed on a light emitting side of the substrate 20. The display part 20 is configured to display images under driving of the substrate 10.

The driving chip 30 is disposed on a light emitting side of the soldering portion 101.

The flexible circuit board 40 is bent from a first surface of the soldering portion 101 to a second surface of the soldering portion 101. A first end of the flexible circuit board 40 is connected to the driving chip 30. The first end is, for example, a left end of the flexible circuit board 40. The first surface is an upper surface of the flexible circuit board 40, and the second surface is a lower surface of the flexible circuit board 40.

The printed circuit board 50 is connected to a second end of the flexible circuit board 40. The second end is, for example, a right end of the flexible circuit board 40.

Figure 3:
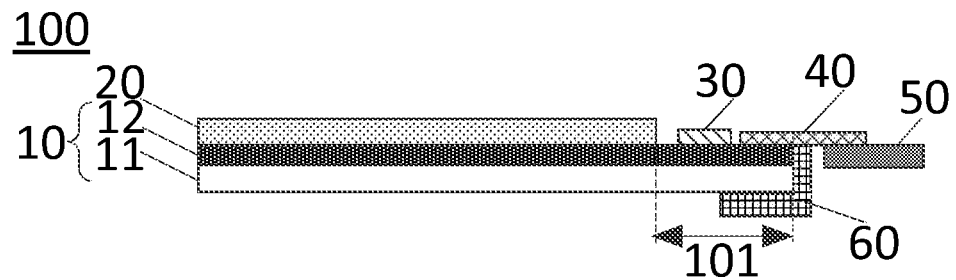
FIG. 3 is a cross-sectional view of a display module when a flexible circuit board is in a flat state according to an embodiment of the disclosure.
Figure 4:
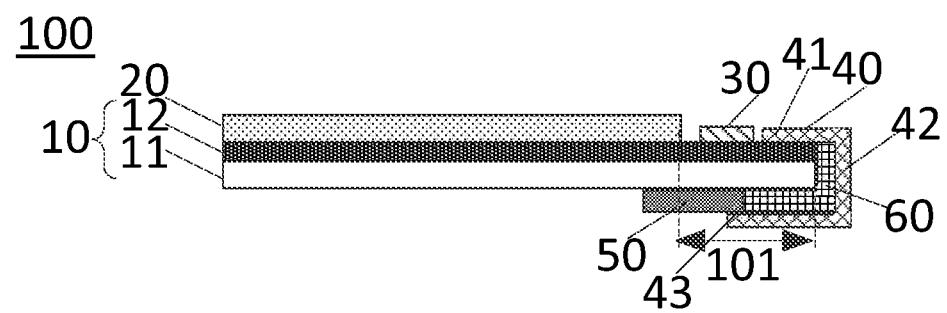
FIG. 4 is a cross-sectional view of the display module when the flexible circuit board is in a bent state according to the embodiment of the disclosure.

Please refer to FIG. 3 and FIG. 4, the present disclosure provides a display module 100 comprising a substrate 10, a display part 20, a driving chip 30, a flexible circuit 40, a printed circuit board 50, and a buffer part 60.

The substrate 10 comprises a soldering portion 101. In an embodiment, the substrate 10 may comprise a backlight module 11 and a driving layer 12. The driving layer 12 may be a switching layer comprising a plurality of switching elements. Each of the switching elements may structurally comprise an active layer, a gate electrode, a source electrode, and a drain electrode. In another embodiment, the substrate 10 may not comprise the backlight module 11. The substrate 10 may be a flexible substrate or an inflexible substrate, which is not limited herein.

The display part 20 is disposed on a light emitting side of the substrate 20. The display part 20 is configured to display images under driving of the substrate 10. In an embodiment, the display part 20 may comprise a plurality of color resists, which may comprise red color resists, green color resists, and blue color resists. In another embodiment, the display part 20 may comprise a plurality of light emitting units, which may be organic light emitting diodes.

The driving chip 30 is disposed on a light emitting side of the soldering portion 101. In an embodiment, the light emitting side is, for example, an upper side of the soldering portion 101.

The flexible circuit board 40 is bent from a first surface of the soldering portion 101 to a second surface of the soldering portion 101. A first end of the flexible circuit board 40 is connected to the driving chip 30. The first end is, for example, a left end of the flexible circuit board 40. In an embodiment, the first surface is an upper surface of the flexible circuit board 40, and the second surface is a lower surface of the flexible circuit board 40. In an embodiment, the flexible circuit board 40 comprises a first connecting portion 41, a second connecting portion 42, and a third connecting portion 43. The first connecting portion 41 is connected to the driving chip 30. The third connecting portion 43 is connected to the printed circuit board 50. The second connecting portion 42 is disposed between the first connecting portion 41 and the third connecting portion 43. The printed circuit board 50 is connected to a second end of the flexible circuit board 40. The second end is, for example, a right end of the flexible circuit board 40.

The buffer part 60 is disposed between the flexible circuit board 40 and the soldering portion 101. When the flexible circuit board 50 is in a flat state, the buffer part 60 covers a set end of the soldering portion 101, which is an end of the soldering portion 101 close to the flexible circuit board 40. In an embodiment, the buffer part 60 is made of a polyimide organic photoresist material or an acrylic organic photoresist material. In an embodiment, in order to further prevent damage to the flexible circuit board 40, the buffer part 60 is disposed between the second connecting portion 42 and the soldering portion 101. In a preferred embodiment, a difference between a thickness of the buffer part 60 and a gap between the second connecting portion 42 and the soldering portion 101 is less than a preset value. The preset value is close to 0. That is, the thickness of the buffer part 60 is equal to or approximately equal to the gap between the second connecting portion 42 and the soldering portion 101.

Figure 5:
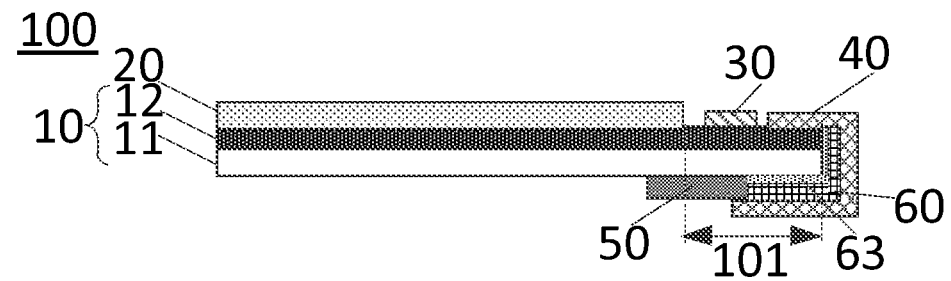
FIG. 5 is a cross-sectional view of a display module when a flexible circuit board is in a bent state according to another embodiment of the disclosure.

Please refer to FIG. 5, in order to improve utilization of light sources, when the substrate 10 comprises the backlight module 11 and the driving layer 12, that is, when the display part 20 is a liquid crystal display panel, a reflective layer 63 is disposed on a side of the buffer part 60 close to the soldering portion 101.

Figure 6:
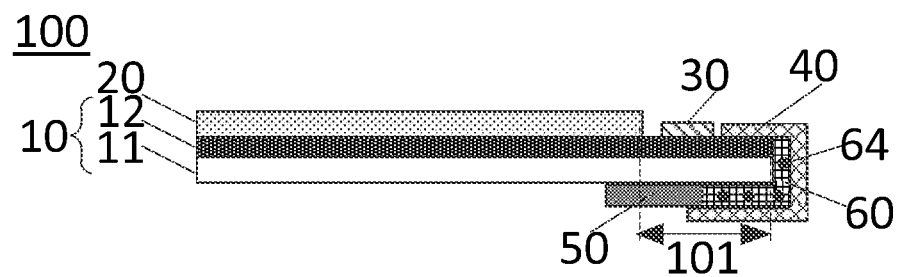
FIG. 6 is a cross-sectional view of a display module when a flexible circuit board is in a bent state according to yet another embodiment of the disclosure.

In an embodiment, as shown in FIG. 6, in order to facilitate heat dissipation of the flexible circuit board 40, the soldering portion buffer part 60 is doped with thermally conductive particles 64. In order to improve an effect of the heat dissipation, the thermally conductive particles 64 may comprise one or more of carbon nanotubes, metal nanoparticles, and metal oxide nanoparticles. In a preferred embodiment of the present disclosure, the metal nanoparticles comprise silver nanoparticles or nickel nanoparticles. In a preferred embodiment of the present disclosure, the metal oxide nanoparticles comprise magnesium oxide nanoparticles or zinc oxide nanoparticles. In a preferred embodiment of the present disclosure, a content of the thermally conductive particles 64 in the buffer part 60 is 0.01% to 5%.

Figure 7:
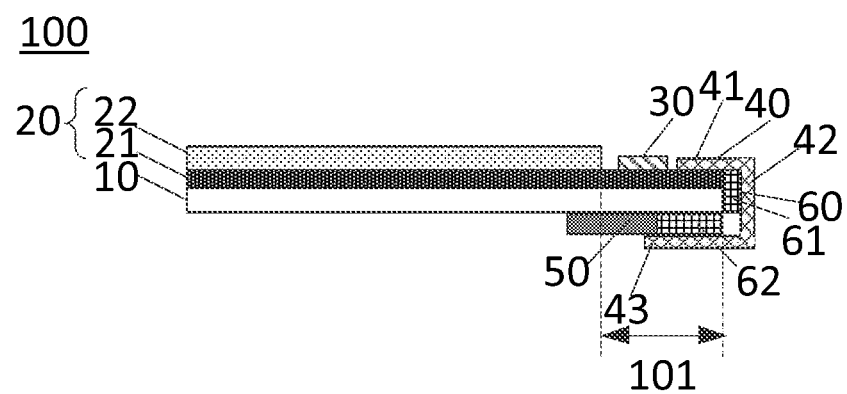
FIG. 7 is a cross-sectional view of a display module when a flexible circuit board is in a bent state according to further another embodiment of the present disclosure.

Please refer to FIG. 7, which is a cross-sectional view of a display module when a flexible circuit board is in a bent state according to further another embodiment of the present disclosure.

A difference between the display module of this embodiment and the display modules of the above embodiments is that the buffer part of this embodiment is a non-integral structure.

As shown in FIG. 7, in order to prevent damage to the flexible circuit board 40 during its bending process, a buffer part 60 of this embodiment comprises a first sub-part 61 and a second sub-part 62. The first sub-part 61 is disposed between the second connecting portion 42 and the set end of the soldering portion 101. The set end is the end of the soldering portion 101 close to the second connecting portion 42. The second sub-part 62 is disposed between the third connecting portion 43 and the second surface of the soldering portion 101. That is, the second sub-part 62 is disposed between the third connecting portion 43 and the lower surface of the soldering portion 101.

In an embodiment, in order to further prevent damage to the flexible circuit board 40 during its bending process, an elastic modulus of the first sub-part 61 is less than an elastic modulus of the second sub-part 62. Because a portion of the flexible circuit board 40 corresponding to the first sub-part 61 is in a bending area, the elastic modulus of the first sub-part 61 is set to be smaller to reduce a bending stress in the bending area, thereby improving a bending resistance of the flexible circuit board 40. Furthermore, the elastic modulus of the second sub-part 62 is set to be larger to support a bottom of the substrate 10, thereby protecting internal components of the display part 20. This improves stability and a yield of the display part 20.

It is understandable that, in other embodiments, the display module 100 further comprises a touch layer (not shown) disposed on a light emitting side of the display part 20. A location of the touch layer is not specifically limited. That is, the display module 100 integrates a touch function. In other words, the aforementioned display module may comprise a display panel and a driving circuit, or may comprise a display panel, a touch layer, and a driving circuit.

It is understandable that FIG. 3 to FIG. 7 only show schematic structural diagrams of the embodiments, but do not limit the present invention.

Because the buffer part is disposed between the flexible circuit board and the soldering portion, friction between the flexible circuit board and the substrate can be reduced, thereby preventing wear of the flexible circuit board and improving product yield.

Figure 8:
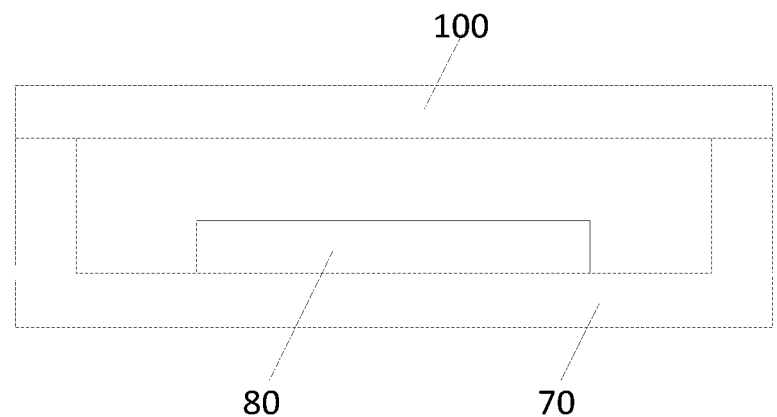
FIG. 8 is a schematic structural diagram of an electronic device according to an embodiment of the present disclosure.

Please refer to FIG. 8, which is a schematic structural diagram of an electronic device according to an embodiment of the present disclosure. The electronic device 300 may comprise a display module 100, a control circuit 80, and a housing 70. It should be noted that the electronic device 300 shown in FIG. 8 is not limited to the above content, and may also comprise other components, such as a camera, an antenna structure, a fingerprint unlocking module, and the like.

The display module 100 is disposed on the housing 70.

In some embodiments, the display module 100 may be fixed to the housing 70, and the display module 100 and the housing 70 form a closed space to accommodate the control circuit 80 and the like.

In some embodiments, the housing 70 may be made of a flexible material, for example, may be a plastic housing or a silicone housing.

The control circuit 80 is installed in the housing 70. The control circuit 80 may be a main board of the electronic device 300. The control circuit 80 can be integrated with one, two, or more of functional components such as a battery, an antenna structure, a microphone, a speaker, an earphone interface, a universal serial bus interface, a camera, a distance sensor, an ambient light sensor, a receiver, and a processor.

The display module 100 is installed in the housing 70 and is electrically connected to the control circuit 80 to form a display surface of the electronic device 300. The display module 100 may comprise a display area and a non-display area. The display area may be configured to display images of the electronic device 300, be used for user's touch manipulation, and the like. The non-display area may be provided with various functional components.

The electronic device 300 may be, but is not limited to, a mobile phone, a tablet computer, a computer monitor, a game console, a television, a display screen, a wearable device, or other domestic installations or household appliances with a display function.

The present disclosure provides a display module and an electronic device, comprising a substrate, a display part, a driving chip, a flexible circuit, a printed circuit board, and a buffer part. The substrate comprises a soldering portion. The display part is disposed on a light emitting side of the substrate. The driving chip is disposed on a light emitting side of the soldering portion. The flexible circuit board is bent from a first surface of the soldering portion to a second surface of the soldering portion. A first end of the flexible circuit board is connected to the driving chip. The printed circuit board is connected to a second end of the flexible circuit board. The buffer part is disposed between the flexible circuit board and the soldering portion. Because the buffer part is disposed between the flexible circuit board and the soldering portion, friction between the flexible circuit board and the substrate can be reduced, thereby preventing wear of the flexible circuit board and improving product yield.

A display module and an electronic device provided by the embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A display module, comprising:
 a substrate comprising a soldering portion;
 a display part disposed on a light emitting side of the substrate;
 a driving chip disposed on a first surface of the soldering portion, wherein the first surface is a light emitting side of the soldering portion;
 a printed circuit board disposed on a second surface of the soldering portion opposite to the first surface;
 a flexible circuit board bent from the first surface of the soldering portion to the second surface of the soldering portion and comprising a first connecting portion, a second connecting portion, and a third connecting portion, wherein the first connecting portion is connected to the driving chip, the third connecting portion is connected to the printed circuit board, and the second connecting portion is disposed between the first connecting portion and the third connecting portion; and
 a buffer part comprises a first sub-part and a second sub-part, wherein the first sub-part is disposed between the second connecting portion and an end of the soldering portion close to the second connecting portion, and the second sub-part is disposed between the third connecting portion and the second surface of the soldering portion.

2. The display module according to claim 1, further comprising:
 a reflective layer disposed on a surface of the second sub-part of the buffer part close to the second surface of the soldering portion.

3. The display module according to claim 1, wherein the buffer part is doped with thermally conductive particles.

4. The display module according to claim 1, wherein a thickness of the buffer part is equal to a gap between the second connecting portion and the end of the soldering portion close to the second connecting portion.

5. The display module according to claim 1, wherein an elastic modulus of the first sub-part is less than an elastic modulus of the second sub-part.

6. The display module according to claim 1, wherein the buffer part is made of a polyimide organic photoresist material.

7. The display module according to claim 1, wherein the buffer part is made of an acrylic organic photoresist material.

8. The display module according to claim 1, further comprising:
 a touch layer disposed on a light emitting side of the display part.

9. An electronic device, comprising a display module, wherein the display module comprises:
 a substrate comprising a soldering portion;
 a display part disposed on a light emitting side of the substrate;
 a driving chip disposed on a first surface of the soldering portion, wherein the first surface is a light emitting side of the soldering portion;
 a printed circuit board disposed on a second surface of the soldering portion opposite to the first surface;
 a flexible circuit board bent from the first surface of the soldering portion to the second surface of the soldering portion and comprising a first connecting portion, a second connecting portion, and a third connecting portion, wherein the first connecting portion is connected to the driving chip, the third connecting portion is connected to the printed circuit board, and the second connecting portion is disposed between the first connecting portion and the third connecting portion; and
 a buffer part comprises a first sub-part and a second sub-part, wherein the first sub-part is disposed between the second connecting portion and an end of the soldering portion close to the second connecting portion, and the second sub-part is disposed between the third connecting portion and the second surface of the soldering portion.

10. The electronic device according to claim 9, further comprising:
 a reflective layer disposed on a surface of the second sub-part of the buffer part close to the second surface of the soldering portion.

11. The electronic device according to claim 9, wherein the buffer part is doped with thermally conductive particles.

12. The electronic device according to claim 9, wherein a thickness of the buffer part is equal to a gap between the second connecting portion and the end of the soldering portion close to the second connecting portion.

13. The electronic device according to claim 9, wherein an elastic modulus of the first sub-part is less than an elastic modulus of the second sub-part.

14. The electronic device according to claim 9, wherein the buffer part is made of a polyimide organic photoresist material.

15. The electronic device according to claim 9, wherein the buffer part is made of an acrylic organic photoresist material.

16. The electronic device according to claim 9, further comprising:
 a touch layer disposed on a light emitting side of the display part.

* * * * *